US011722066B2

(12) United States Patent
    Mazurek

(10) Patent No.: US 11,722,066 B2
(45) Date of Patent: Aug. 8, 2023

(54) SINGLE STAGE POWER FACTOR CORRECTING SYNCHRONOUS HARMONIC CONVERTER

(71) Applicant: Lee Fredrik Mazurek, Groton, CT (US)

(72) Inventor: Lee Fredrik Mazurek, Groton, CT (US)

(73) Assignee: Lee Fredrik Mazurek, Groton, CT (US)

( * ) Notice: Subject to any disclaimer, the term of this patent is extended or adjusted under 35 U.S.C. 154(b) by 0 days.

(21) Appl. No.: 17/727,774

(22) Filed: Apr. 24, 2022

(65) Prior Publication Data

US 2022/0393605 A1     Dec. 8, 2022

Related U.S. Application Data

(60) Provisional application No. 63/197,572, filed on Jun. 7, 2021.

(51) Int. Cl.
| | |
|---|---|
| *H02M 1/42* | (2007.01) |
| *H02M 3/335* | (2006.01) |
| *H02M 3/00* | (2006.01) |
| *H02M 1/12* | (2006.01) |
| *H02M 1/00* | (2006.01) |

(52) U.S. Cl.
    CPC ..... *H02M 3/33584* (2013.01); *H02M 1/0009* (2021.05); *H02M 1/12* (2013.01); *H02M 1/4241* (2013.01); *H02M 3/01* (2021.05); *H02M 3/33573* (2021.05); *H02M 1/4208* (2013.01); *H02M 1/4258* (2013.01)

(58) Field of Classification Search
    CPC . H02M 1/4208; H02M 1/4241; H02M 1/4258
    See application file for complete search history.

(56) References Cited

U.S. PATENT DOCUMENTS

| | | | | |
|---|---|---|---|---|
| 8,693,213 | B2* | 4/2014 | Jungreis | H02M 1/4241 |
| | | | | 363/17 |
| 10,680,510 | B2* | 6/2020 | Elferich | H02M 3/01 |
| 2003/0222633 | A1* | 12/2003 | Hwang | H02M 1/36 |
| | | | | 323/282 |
| 2010/0019697 | A1* | 1/2010 | Korsunsky | H05B 45/3725 |
| | | | | 315/307 |
| 2020/0412238 | A1* | 12/2020 | Zhu | H02M 1/4233 |
| 2021/0111629 | A1* | 4/2021 | Gray | H02M 3/33569 |

* cited by examiner

*Primary Examiner* — Gary A Nash

(57) ABSTRACT

A synchronous average harmonic current controller for a line connected bidirectional resonant power converter results in a harmonic voltage gain closely related to the commanded bridge duty cycles. A primary bridge has its duty cycle set to achieve controlled line power transfer and voltage regulation of a primary bus energy storage capacitor. A secondary bridge circuit has its duty cycle set to achieve voltage regulation of secondary bus energy storage capacitor. A first embodiment uses the independent energy storage elements to achieve power factor correction and low noise regulation using a single stage. A second embodiment uses feedforward duty cycle control to achieve isolated voltage regulation using the well-defined voltage gain resulting from the synchronous average harmonic current controller.

14 Claims, 5 Drawing Sheets

SINGLE STAGE POWER FACTOR CORRECTING SYNCHRONOUS HARMONIC CONVERTER

CROSS-REFERENCE TO RELATED APPLICATIONS

This application claims the benefit of U.S. provisional application 63/197,572 filed Jun. 7, 2021 which is incorporated by reference herein in its entirety. This application is related to U.S. non-provisional application Ser. No. 17/727,757 filed Apr. 24, 2022.

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISC OR AS A TEXT FILE VIA THE OFFICE ELECTRONIC FILING SYSTEM

Not applicable

STATEMENT REGARDING PRIOR DISCLOSURES BY THE INVENTOR OR A JOINT INVENTOR

Not applicable

BACKGROUND OF THE INVENTION

The present disclosure generally relates to a power factor corrected bidirectional power conversion system, and more specifically, to a single stage regulated resonant power converter with synchronous average harmonic current control and methods of controlling the same.

Power factor corrected off-line converters are used to provide isolated power to electrical loads with reduced line harmonic current conduction losses. The three-stage power converter architecture commonly used in prior art includes: the rectifier stage which converts AC line voltage to DC bus voltage, the power factor correction stage which controls the line current to match the frequency and phase of the line voltage, and the DC-to-DC converter stage which transmits power to an isolated DC bus. FIG. 1 illustrates a prior implementation of the three-stage power converter which includes: a bridge rectifier (100), a current shaping power factor correction stage (106), and a resonant DC to DC converter stage (101 and 102). Efficiency and parts count may be improved by combining the rectifier and power factor correction stages into one stage. FIG. 2 shows a prior art example which combines the bridge rectifier (100) and power factor correction stage (106) from FIG. 1 into a single active rectifier stage (200), and its associated controller (206), which performs both functions. The power factor correction stage shown in FIG. 2 may be operated in series with a DC-to-DC converter stage (such as 101 and 102) to form a two-stage power converter. Other prior art architectures include the flyback converter and the Ćuk converter which reduce power converter stages by incorporating power factor correction and isolated DC to DC conversion into a single stage. The Ćuk converter is further optimized in prior art through the use of a bidirectional switch which allows for direct AC input and the elimination of the bridge rectifier stage. Flyback and Ćuk converter implementations may require large magnetic and switch currents respectively which limit them to lower power applications. They also have output voltage ripple due to power factor corrected input current being coupled to their output, which results in an additional regulation stage being required for low noise applications. It is desirable to improve single stage power factor corrected converters by reducing switching current, and improving voltage regulation in low noise applications.

BRIEF SUMMARY OF THE INVENTION

In one aspect, the objective of this invention is to implement an efficient single stage bidirectional power factor corrected converter with improved voltage regulation. This objective is accomplished in the present invention by merging a power factor correction stage with a regulated resonant converter using synchronous average harmonic current control. FIG. 3 illustrates one embodiment of the presently invented converter whose elements are summarized here. An active boost-boost primary bridge (301) regulates a first bus voltage (V1) using a current shaping power factor correction controller (306). The power factor correction controller determines the modulated voltage at the primary bridge (VA and VB) which is also used for isolated power transmission. The primary bridge voltage is harmonically filtered and coupled across an isolation transformer (310) in series with a resonant network (305). The secondary bridge (302) is harmonically synchronized to the primary bridge using a synchronous average harmonic current controller (308). The synchronous average current is estimated by sensing (307) the (inferred) transformer current and averaging and compensating it over each half of the switching time period with a switched capacitor filter. The common signal of each half period average is used to apply negative feedback on the differential duty cycle to reduce locally recirculating bridge current, and the difference of the half period averages is used to apply negative feedback on the phase to reduce synchronous transformer ripple current. A pulse width modulation stage compares a reference duty cycle to a triangle modulation waveform with the negative feedback signals superimposed by the synchronous average harmonic current controller. At the operating point established by the synchronous average harmonic current controller, the primary and secondary bus voltages are harmonically related by the sines of their respective duty cycles. Given that the first duty cycle is controlled by the power factor corrected regulation of the primary bus voltage, the second duty cycle is used for regulation of the secondary bus voltage (V2). The presently invented converter makes efficient use of a single power stage composed of a synchronous input and output bridge without requiring additional power stages for low noise regulation.

These and additional objects and advantages provided by the embodiments described herein will be more fully understood in view of the following detailed description, in conjunction with the drawings.

BRIEF DESCRIPTION OF THE SEVERAL VIEWS OF THE DRAWING(S)

DETAILED DESCRIPTION OF THE INVENTION

Figure 1:
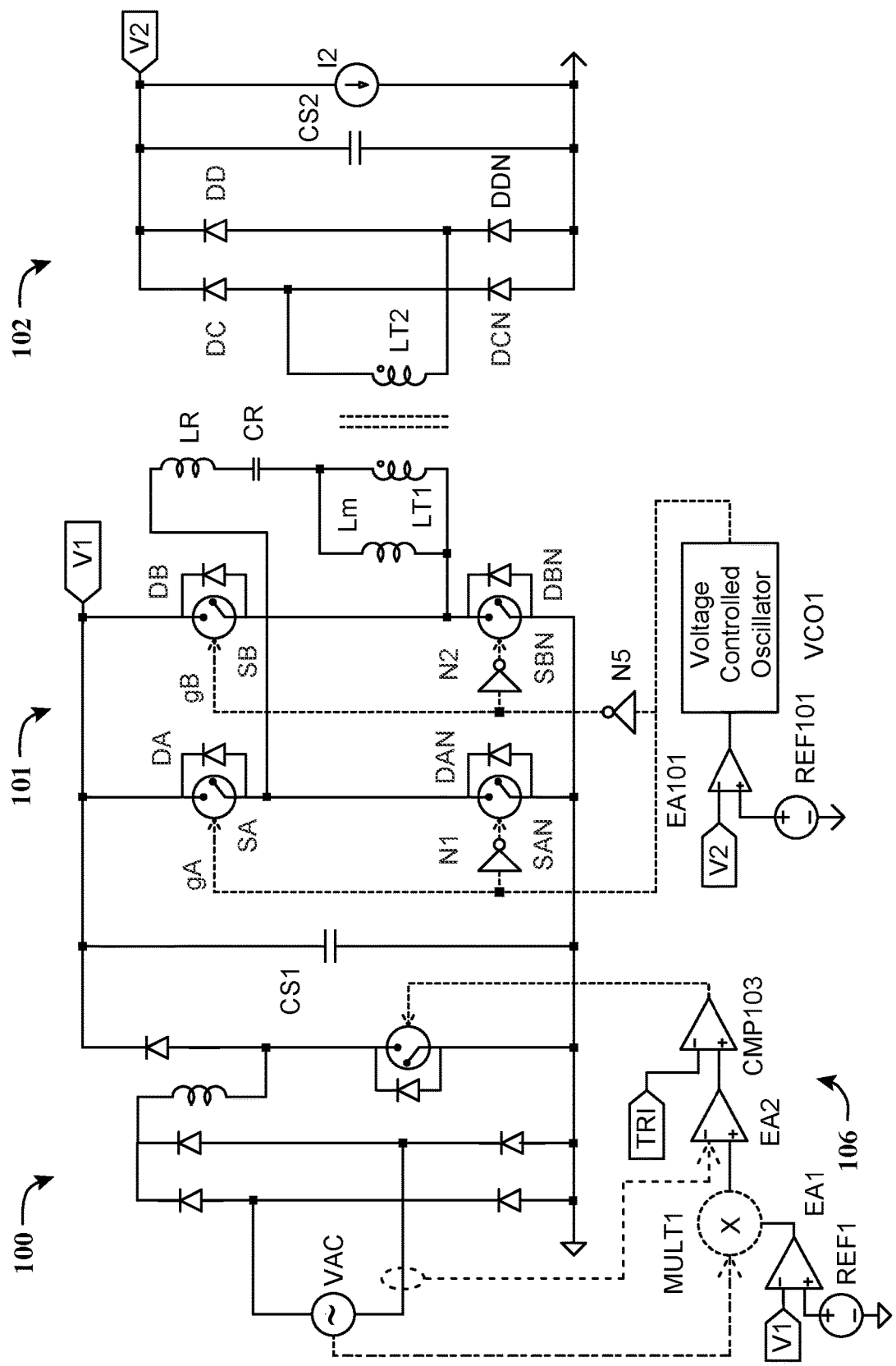
FIG. 1 illustrates an example of a prior art three stage power converter composed of a rectifier stage, power factor correction stage, and DC-to-DC isolation stage.
Figure 2:
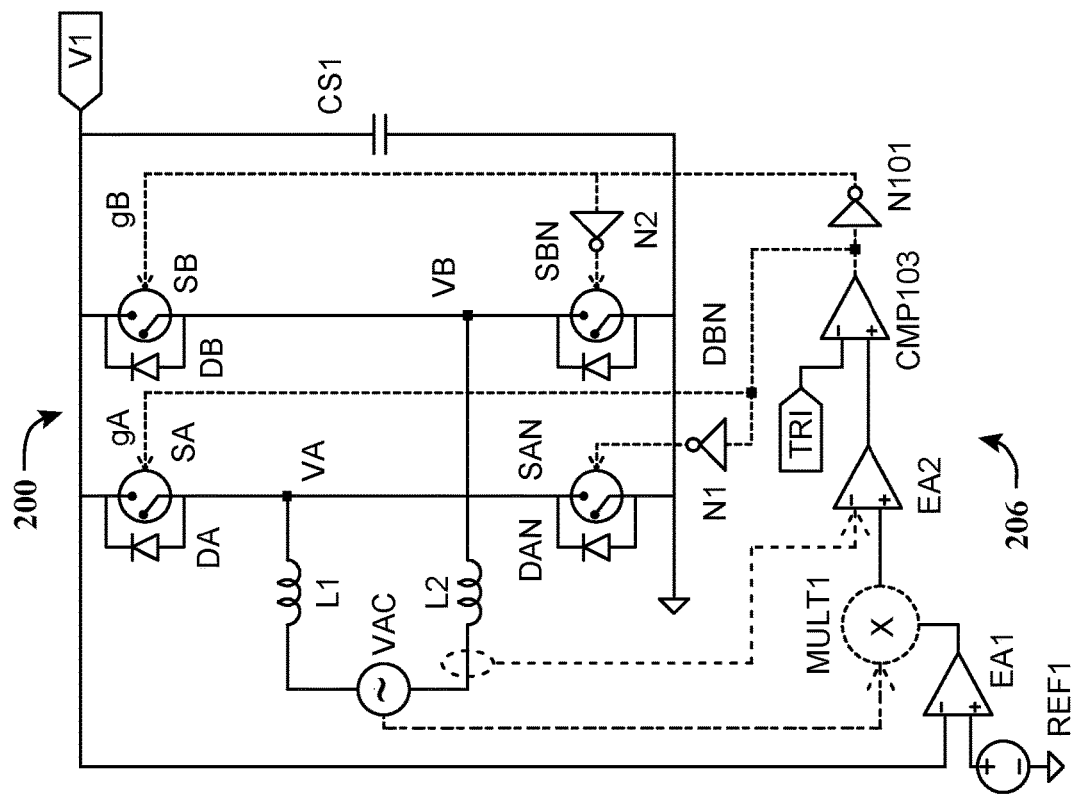
FIG. 2 illustrates a prior art combination of a rectifier and power factor correction stage using a boost-boost power converter.
Figure 3:
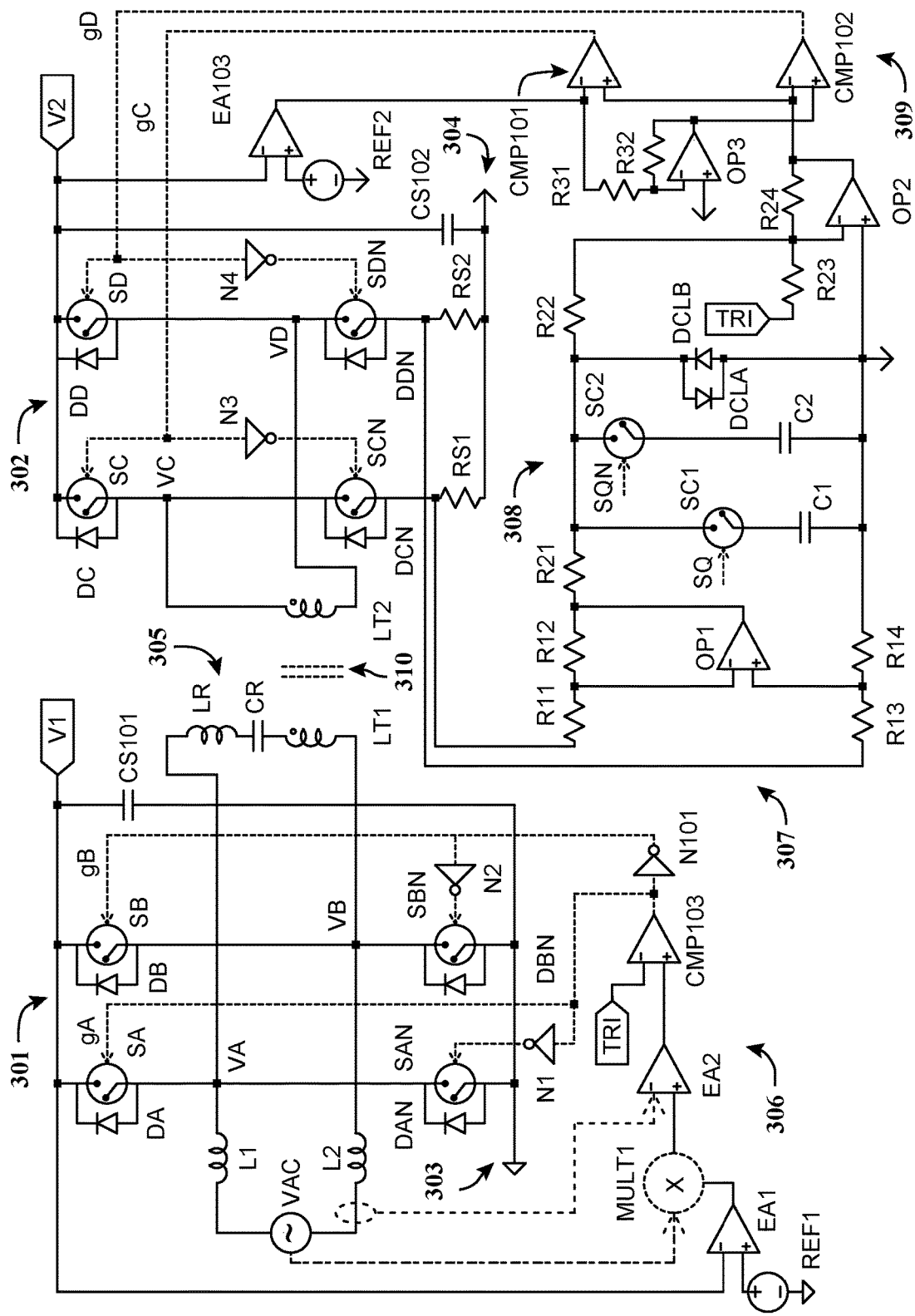
FIG. 3 is a schematic illustrating the presently invented single stage power factor correcting synchronous harmonic converter according to one or more embodiments shown and described herein.
Figure 4A:
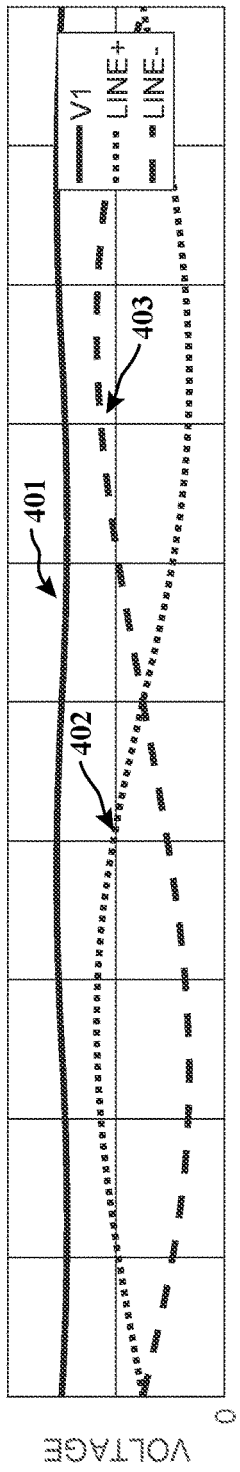
FIG. 4A shows voltages at the primary bridge for the embodiment shown in FIG. 3, where V1 (401) shows the primary bridge DC bus voltage, and Line+ (402) and Line− (403) show the average voltage differentially applied by VAC at nodes VA and VB.
Figure 4B:
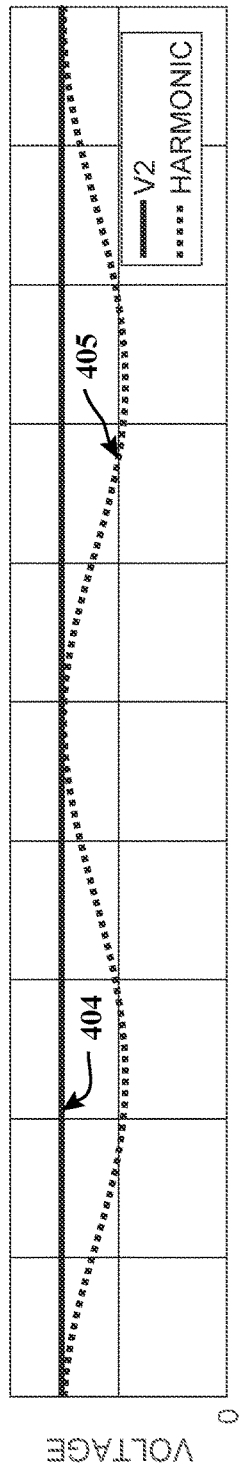
FIG. 4B shows voltages at the secondary bridge for the embodiment shown in FIG. 3, where V2 (404) shows the secondary bridge DC bus voltage, the minimum boost voltage, which is given by the fundamental switching harmonic (405) between nodes VC and VD.
Figure 4C:
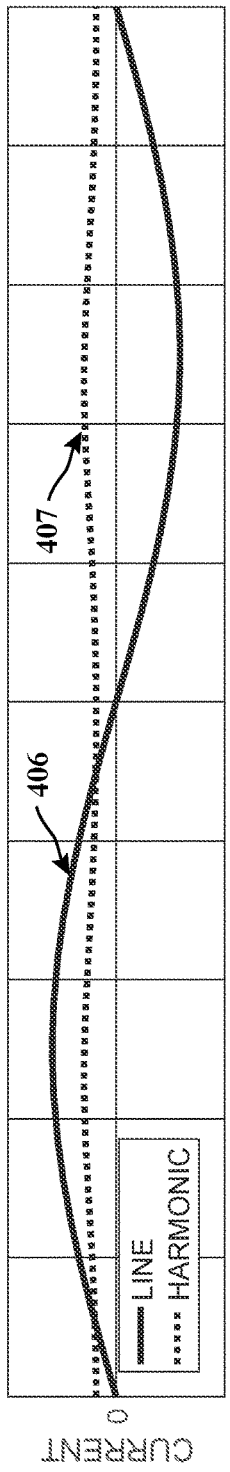
FIG. 4C shows line current (406), which is the current through VAC in FIG. 3, and RMS harmonic current (407) through the transformer secondary (FIG. 3, LT2) for the embodiment given in FIG. 3.
Figure 4D:
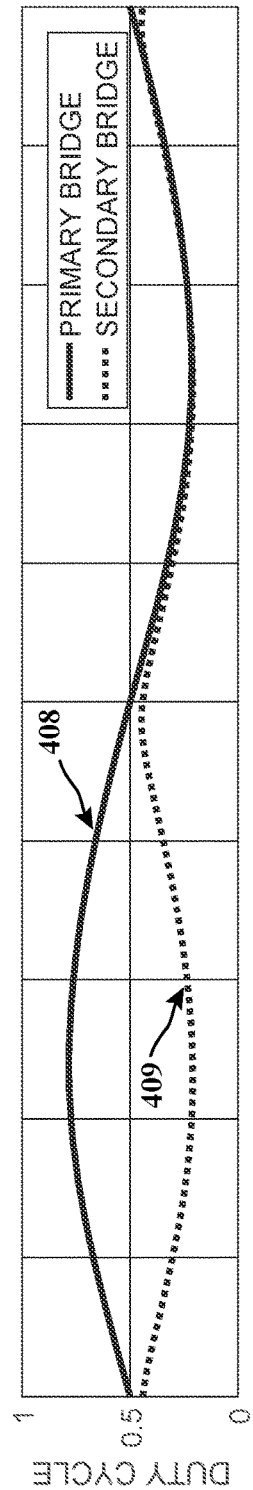
FIG. 4D shows the duty cycles for the primary side bridge (408) and secondary side bridge (409) for the embodiment given in FIG. 3.
Figure 5:
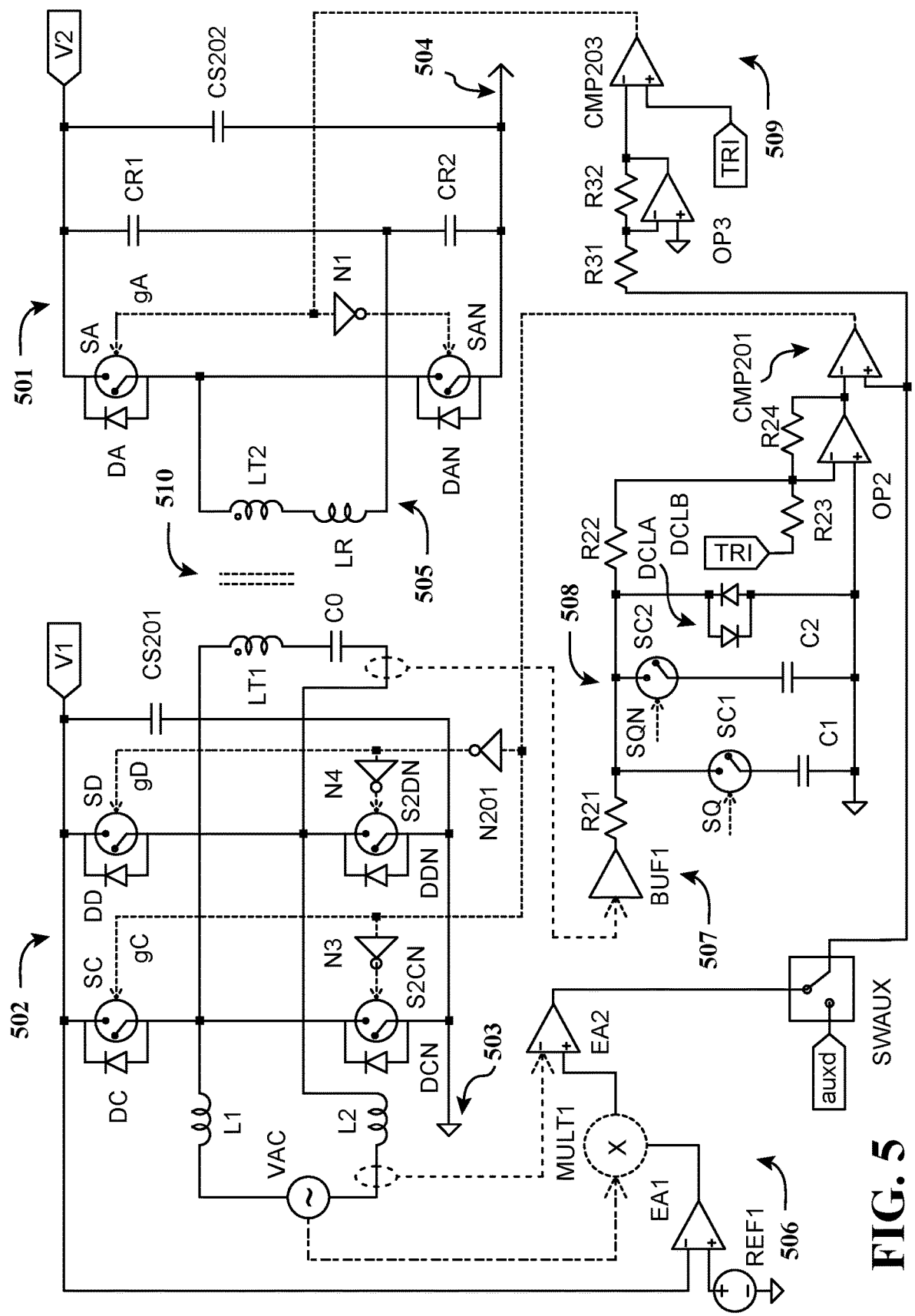
FIG. 5 is a schematic of a single stage power factor correcting synchronous harmonic converter with half bridge secondary and feedforward voltage control according to one or more embodiments shown and described herein.

Embodiments described herein generally relate to regulated single stage power factor corrected converters and methods of forming using synchronous average harmonic current control. As shown and described herein, new embodiments of single stage power factor correcting synchronous harmonic converters are provided. The functionality of the traditional three stage off-line AC to DC converter is efficiently implemented in the present invention using a single stage. The presently invented converter has multiple functions which are combined using a synchronous average harmonic current controller. The controller maintains a voltage relationship between the primary and secondary side bridge which is used for regulation. This results in only a single primary and secondary side bridge being used to perform rectification, power factor correction (PFC), and isolated regulation. The presently invented converter's first embodiment is shown in detail in FIG. 3. Corresponding example waveforms for FIG. 3 are shown in FIG. 4. A second embodiment with feedforward control and reduced parts count is shown in FIG. 5. These embodiments may achieve efficiency benefits relative to traditional architectures because they have fewer chained efficiency losses and they can be implemented using few parts.

The first embodiment of the presently invented power converter is illustrated in FIG. 3 with a full bridge arrangement. This embodiment has lower switch currents and improved regulation relative to the second embodiment (FIG. 5) which uses a half bridge with lower parts count. FIG. 3 is illustrated using numbered blocks (3XX) which are composed of lettered components. The numbered blocks are described at a high level in this paragraph, and followed by detailed descriptions. The primary bridge (301) performs rectification and boost power factor correction using a PFC controller (306). The PFC circuit controls the duty cycle of the primary bridge to shape the line current and regulate the voltage of the primary bus (V1). A transformer (310) isolates the primary voltage reference (303) from the secondary voltage reference (304). The transformer couples the primary bridge harmonic voltage filtered by the resonant network (305) to the secondary bridge (302). A bridge current sensor (307) is fed back by the synchronous average harmonic current controller (308) to the pulse width modulation stage (309) which is also used to regulate the secondary bus voltage (V2).

A PFC controller (306) shapes the line current and regulates the bus voltage (V1) across the first energy storage capacitor (CS101) by controlling the switches of the primary side bridge (301). An error amplifier (EA1) regulates the bus voltage (V1) relative to the first reference (REF1) using negative feedback to generate an average current command to the multiplier (MULT1). The multiplier scales the average current command by the sensed line voltage to generate a shaped current command. The line voltage may be sensed by methods familiar to those skilled in the art such as by using a difference amplifier. A second error amplifier (EA2) regulates the line current (or the current through the voltage source VAC) relative to the shaped current command generated by the multiplier output. The line current may be sensed by methods familiar to those skilled in the art such as using a resistive shunt and isolation amplifier, a magnetic current sensor or inferred from the modulated current in the primary bridge. A comparator (CMP103) compares the output of the second error amplifier to a synchronously clocked triangle waveform to pulse width modulate the primary side bridge control signals, gA and gB. The complementary signal gB is logically inverted from gA using N101. Other synchronously clocked power factor correction methods known to those skilled in the art may also be used to generate control signals for the primary bridge.

The primary side bridge (301) is a full H-bridge with four switches (SA, SAN, SB, SBN). The similarly named switches (SA/SAN and SB/SBN) are driven with complementary signals, such that SAN has a logically inverted input (using N1) from SA, and SBN has a logically inverted input from SB (using N2). The switches are driven such that either the high side switch SA (or SB) or its complement SAN (or SBN) is on, with appropriate deadtime to address shoot through current. Each switch (SA, SAN, SB, SBN) is implemented according to the state of the art, with MOSFETS or GANFETS and their appropriate gate drivers being preferred for the embodiment shown. The switches have explicit or apparent integral diodes across them (DA, DAN, DB, DBN) which prevent excessive reverse bias. The primary side bridge (301) is connected to the line voltage (VAC) through inductors L1 and L2 and connected to a transformer primary (LT1) through a resonant network (305).

A transformer secondary (LT2) couples a primary bridge (301) harmonic voltage to a secondary bridge (302). A secondary bridge is illustrated using a full H-bridge with four switches (SC, SCN, SD, SDN). The gate signal gC is used to drive SC and is logically inverted using N3 to drive SCN. The gate signal gD is used to drive SD and is logically inverted using N4 to drive SDN. Each switch (SC, SCN, SD, SDN) is implemented according to the state of the art, with MOSFETS or GANFETS and their appropriate gate drivers being preferred for the embodiment shown. The switches have explicit or apparent integral diodes across them (DC, DCN, DD, DDN) which prevent excessive reverse bias. A third error amplifier (EA103) regulates the duty cycle for the secondary side bridge using feedback on the secondary bus voltage (V2) relative to the second reference (REF2).

A bridge current sense amplifier (307) is used to sense the (inferred) transformer secondary current to drive the synchronous average harmonic current controller (308). The sensor is implemented in FIG. 3 using resistive shunts (RS1, RS2) and a non-isolated difference amplifier (OP1, R11, R12, R13, R14). The implemented sensor has a measurement bandwidth which is higher than the switching frequency. Another method for implementing a current sensor is to use a resistive shunt in series with the secondary (LT2) and an isolation amplifier.

The synchronous average harmonic current controller (308) superimposes a control signal onto the triangle waveform using negative feedback. The controller is composed of a summing amplifier (R21, R22, R23, R24 and OP2), and switches (SC1, SC2) which alternately sample capacitors (C1, C2) and clamping diodes (DCLA, DCLB). The switched capacitors (C1, C2) filter and compensate the synchronous average current over each half of the switching period. The switches for each capacitor (SC1 and SC2) are driven by complementary synchronous square wave signals (SQ and SQN) and are preferentially implemented using CMOS or JFET integrated analog switches. The clamping diodes (DCLA, DCLB) limit the amplitude of the feedback signal. The voltages at the switched capacitors, C1 and C2, are sampled using SC1 and SC2 respectively and superimposed using negative feedback onto the modulation waveform.

A triangle waveform with superimposed feedback signal output from OP2 is used by the pulse width modulation network (309) to modulate the duty cycle command given by the third error amplifier (EA103). A pulse width modulation circuit is composed of the inversion stage (R31, R32, OP3) and comparators (CMP101 and CMP102). The modulation process is sensitive to both differential duty cycle control (common to the full period) and phase control (different for each half of the switching period) signals used for feedback. The common voltage between C1 and C2 is used to adjust the differential duty cycle controlling the average voltages of each half of the H-bridge (VC and VD) to reduce low frequency recirculating current. The differential voltage between C1 and C2 is used to adjust the phase of the second bridge (302) relative to the first (301) to minimize (or reduce to an appropriate threshold) the synchronous average harmonic current.

The synchronous harmonic current error relates the primary and secondary bus voltage as shown in EQ1:

$$\varepsilon = -((V_1 \cdot \vec{g}_{AB,\omega 1} - V_2 \cdot \vec{g}_{CD,\omega 1})/Z_{\omega 1}) \cdot g^*_{SQ,\omega 1} \qquad \text{EQ1}$$

where $(V_1 \cdot \vec{g}_{AB,\omega 1} - V_2 \cdot \vec{g}_{CD,\omega 1})/Z_{\omega 1}$ is the switching harmonic current in the secondary coil measured using the bridge current sensor, and $\vec{g}_{SQ,\omega 1}$ is the first harmonic expansion of the square wave (SQ) used to drive the averaging performed by the switched capacitor filter. The impedance ($Z_{\omega 1}$) of the resonant network (305) is given by the series impedance summation of LR and CR at the first harmonic. A magnetizing inductance may be present in parallel with LT1 but is not required. The differential primary bridge voltage, $V_1 \cdot g_{AB,\omega 1}$, is the difference between nodes VA and VB (in FIG. 3), where $g_{AB,\omega 1}$ is the differential logical gate signal between $g_A$ and $g_B$ at the first harmonic, $\omega 1$. The harmonic differential secondary bridge voltage, $V_2 \cdot g_{CD,\omega 1}$, is the difference between VC and VD (in FIG. 3), where $g_{CD,\omega 1}$ is the differential signal between $g_C$ and $g_D$ at the first harmonic.

The synchronous average harmonic current controller reduces error, $\varepsilon$, to zero (or an appropriate threshold) which results in $V_1$ and $V_2$ being related according to the ratio of the first harmonic of the gate signals, $\vec{g}_{AB,\omega 1}$ and $\vec{g}_{CD,\omega 1}$. The impedance of the resonant network, $Z_{\omega 1}$, and the synchronous square wave, $g^*_{SQ,\omega 1}$ form a harmonic filter which results in the first harmonic controlling the voltage equilibrium. The impedance and square wave terms are common to EQ1 which result in them cancelling when solving for the voltages. The resulting voltage relationship using the synchronous average harmonic current controller is given as:

$$\frac{V_2}{V_1} = \frac{\sin(\pi \cdot d_1)}{\sin(\pi \cdot d_2)} \qquad \text{EQ 2}$$

which is the ratio of the sine of the primary duty cycle, $d_1$, and secondary duty cycle, $d_2$, respectively. The voltage relationship given in EQ2, which results from synchronous average harmonic current control, makes voltage regulation straightforward. The primary bridge duty cycle, $d_1$, and bus voltage, $V_1$, is controlled by the PFC controller (306). A third error amplifier, EA103, controls the secondary bridge duty cycle $d_2$ to regulate the output voltage, $V_2$. EQ2 is shown for a 1:1 turns ratio and the voltage for other transformer configurations can be scaled by adjusting the turns ratio, which results in a proportional change.

The first embodiment of the single stage power converter (FIG. 3) may be configured for output current control with the addition of a current error amplifier in series with the output of EA103. The current error amplifier could be configured to feed back on the sum of the currents through RS1 and RS2. This strategy can be used to simplify the voltage control law, balance the current load to multiple paralleled converters, or to shape the current draw relative to the harmonic voltage (405) to improve efficiency. An output current controller is not shown in the first embodiment because it adds parts complexity.

The voltage, current, and duty cycle waveforms for a representative embodiment of FIG. 3 are shown in FIG. 4 to illustrate the theory of operation. The time axis of the figure has units of fractional period, where the period is one cycle of the AC line input voltage given by VAC. The converter output is loaded with a constant current which results in constant power draw. FIG. 4A shows the primary bus voltage V1 (401) and the AC LINE+ (402) and LINE− (403) voltages. The line voltages are driven by a differential input given by VAC across inductors L1 and L2 in FIG. 3. The signal LINE+ corresponds to the average voltage at node VA in FIG. 3 given by $d_1 \cdot V_1$, and LINE− corresponds to the average voltage at VB given by $(1-d_1) \cdot V_1$. FIG. 4B shows the secondary bus V2 (404), and the HARMONIC voltage (405). The harmonic voltage is $V_1 \cdot \sin(\pi \cdot d_1)$ which results from the primary side bridge voltage whose duty cycle is given by the PFC controller. The harmonic voltage is the minimum secondary side bus voltage (as shown in EQ2 using $d_2 = 0.5$). For other duty cycle values for $d_2$, the secondary side converter operates in a boost configuration. The third error amplifier uses the second reference (EA103, REF2 of FIG. 3) to adjust the duty cycle, $d_2$, such that $V_2$ is a constant which is higher than the harmonic voltage. FIG. 4C shows the LINE current (406) and the HARMONIC current (407). The line current, or current through the line voltage source VAC, is shaped to match the line voltage by the power factor correction circuit. This sinusoidal line current results in the ripple component on the primary DC bus V1 (401), which is regulated by the converter to result in the secondary DC bus V2 (404). The harmonic current is given by the constant power draw divided by the harmonic voltage, and multiplied by $\pi/\sqrt{8}$ (which is the ratio between the RMS and average of a sine wave). This ratio is approximately maintained by the synchronous average harmonic current controller which the reduces ripple current unnecessary for harmonic power transmission. The line and harmonic currents are the dominant contributors to the current in the primary and secondary side bridges respectively. For this example, the harmonic current is lower than the line current due to the high boost voltage which results in the conduction losses associated with the harmonic current being smaller than the conduction losses associated the line current. FIG. 4D shows the duty cycle for the PRIMARY BRIDGE (408) and SECONDARY BRIDGE (409) respectively. The primary bridge duty cycle results in the average voltage between VA and VB approximately matching the line voltage with a small offset to create net current flow. The secondary duty cycle is adjusted to regulate the secondary bus voltage, V2, to a nearly constant voltage. The sine of the primary and secondary duty cycle are approximately equal which results in a conversion ratio (given in EQ2) of approximately one with a small permutation to achieve regulation. Equivalent regulation can be achieved using a duty cycle on the secondary bridge which is greater than or less than 0.5 because of the symmetry of the sine function ($\sin(\pi \cdot d_2) = \sin(\pi \cdot (1-d_2))$). In this embodiment, the secondary duty cycle remains less than 0.5 so that the polarity of the feedback on the third error amplifier, EA103, does not change. This results in stable feedback regulation of the secondary bus voltage A second embodiment of the presently invented power converter is illustrated in FIG. 5. The embodiment illustrated in FIG. 5 is used to save on parts relative to the embodiment in FIG. 3 for instances where the primary side bus voltage, V1, has sufficient regulation. In FIG. 5, the secondary bridge duty cycle is set to follow the primary bridge duty cycle using feedforward control. Feedforward control is accomplished by setting the duty cycle $d_2 = d_1$ or $d_2 = 1 - d_1$ which results in $\sin(\pi \cdot d_1) = \sin(\pi \cdot d_2)$ and a constant input to output relation given EQ2. The second embodiment uses a capacitive half bridge for the secondary bridge which results in both power and control parts reduction relative to the first embodiment.

The second embodiment shown in FIG. 5 has voltage sensing on the primary side which is possible due to the bidirectional voltage relationship (EQ2) established by the synchronous average harmonic current controller. The first embodiment has a current sensor (307), sensed bridge (302), and synchronous harmonic controller (308) on the secondary side. The second embodiment has a current sensor (507), sensed bridge (502), and synchronous harmonic controller (508) placed on the primary side. The current sensor for the second embodiment is floating and buffered using BUF1 so that the current through the transformer primary LT1 is measured separately from the line current (through VAC). The power factor correction for the second embodiment (506) uses the same overall components as the first embodiment (306). A transformer (510) isolates the primary reference voltage (503) from the secondary reference voltage (504). The first embodiment has a resonant network (305) in series with the primary bridge (301), and the second embodiment has its resonant network (505) in series with the secondary bridge (501). The second embodiment does not have regulation on the secondary side. Its secondary duty cycle signal, which is derived from the duty cycle for power factor correction, drives the secondary bridge modulation circuit (509) directly.

The primary bridge (501) and PFC controller (506) for the second embodiment work together to regulate the voltage across energy storage capacitor (CS201). A comparator (CMP201) compares the output of the second error amplifier (EA2) to a triangle wave with superimposed synchronous average harmonic feedback to pulse width modulate the primary side bridge control signals, gC and gD. The primary side bridge (502) is a full H-bridge with four actively driven switches (SC, SCN, SD, SDN). The gate signal, gD, is inverted from gC using N201. The resonant network 505, (LR and CR1/CR2) is located on the secondary side in this embodiment to take advantage of the split capacitor bridge arrangement. A blocking capacitor, C0, is located on the primary side to block currents associated with the differential DC voltage between each half of the primary H-bridge. For this embodiment, the secondary side has a half bridge (502) arrangement which is composed of (SA, SAN, DA, DAN). This converter has a fixed feedforward voltage gain of two due to the full bridge on the primary and capacitive half bridge on the secondary. The transformer turns ratio can be altered to change the gain proportionally.

The second embodiment (shown in FIG. 5) may be altered to buck regulate the output by adjusting the switching frequency. Increasing the switching frequency relative to the resonance of the network (505) increases the output impedance and limits the current. An error amplifier may be configured to monitor the output voltage and adjust the voltage to a frequency-controlled oscillator to achieve automatic buck regulation. This may be useful if the output voltage varies over a large range.

Both the first (FIG. 3) and second (FIG. 5) embodiment allow for bi-directional power transfer without modification. The second embodiment (FIG. 5) can be simplified for inverter applications by using a switch (SWAUX) to drive the duty cycle command directly (using auxd) in place of the output of EA2. The switched operational mode is useful to control the line voltage directly with the same power supply running from batteries (without line connection).

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A single stage bi-directional power converter comprising:
   a first bridge circuit comprising a first plurality of switching devices across a first voltage bus and energy storage capacitor whose switches are coupled to a first transformer winding of a transformer device and a line voltage in series with at least one inductor;
   at least one first controller circuit configured to generate a first duty cycle which controls the power transferred to and from a line voltage using the first plurality of switching devices;
   a second bridge circuit comprising a second plurality of switching devices across a second voltage bus and energy storage capacitor whose switches are coupled to a second transformer winding of the transformer device;

at least one second controller circuit configured to generate a second duty cycle which regulates the second bus voltage using the second plurality of switching devices to boost the harmonically filtered transformer voltage;

a resonant network comprised of at least one capacitor in series with the first transformer winding, and at least one inductor in series with the first or second transformer winding; and a synchronous average harmonic current controller comprised of a feedback circuit which reduces to a minimum (or an appropriate threshold) the synchronous average harmonic current averaged over each half of the switching period by altering the modulation waveform of at least one of the first or second controller circuit.

2. The power converter of claim 1, wherein the duty cycle command to the first controller is generated by a power factor correction circuit comprised of:

a voltage error amplifier which subtracts a signal proportional to the first bus voltage from a voltage reference to generate an average current command;

a multiplier which shapes an average current command by a signal proportional to the line voltage to generate a shaped current command; and a current error amplifier which subtracts a signal proportional to the line current from the shaped current command to generate a duty cycle command.

3. The power converter of claim 1, wherein the duty cycle command to the first controller is generated by an arbitrary voltage reference.

4. The power converter of claim 1, wherein the first plurality of switching devices comprises a full bridge circuit comprising at least two pairs of switching devices.

5. The power converter of claim 1, wherein the second plurality of switching devices comprises a full bridge circuit comprising at least two pairs of switching devices.

6. The power converter of claim 1, wherein the second plurality of switching devices comprises at least two switching devices coupled to at least one capacitor to form a capacitive half-bridge.

7. The power converter of claim 6, wherein the capacitive half bridge forms part of a resonant network.

8. The power converter of claim 1, wherein the transformer device comprises the first transformer winding and the second transformer winding, and further comprising a determined turn ratio relative to the first bridge circuit.

9. The power converter of claim 1, wherein the synchronous average harmonic current controller is further comprised of:

a switched capacitor filter circuit configured to average and compensate current synchronously over each half of a switching period and alternately sample each half switching period average;

a summing circuit which sums a synchronous triangle wave with the negative feedback signals given by the switched capacitor filter output which is further comprised of a common voltage and difference voltage for each half switching period average; and a modulation circuit which is given a duty cycle command and modulates it with a triangle wave with superimposed feedback signals wherein the common voltage and difference voltage of each switched capacitor modifies the bridge differential duty cycle and phase respectively.

10. The power converter of claim 9, further comprising a current sensor which provides a measure of the current in the second transformer winding to drive the synchronous average harmonic current controller wherein the current sensor is further comprised of at least one resistive shunt and preamplifier.

11. The power converter of claim 9, further comprising an isolated current sensor which provides a proportional measure of the current in the first transformer winding to drive the synchronous average harmonic current controller, and at least one DC blocking capacitor in series with the second transformer winding.

12. The power converter of claim 1, wherein the duty cycle command to the second controller is generated by error amplifier comprised of a circuit which subtracts a signal proportional to the output voltage error relative to a reference.

13. The power converter of claim 1, wherein the duty cycle command to the second controller is generated by a feedforward circuit which sets the secondary bridge duty cycle based on the primary bridge duty cycle.

14. A method comprising:

generating a first duty cycle which controls the power transferred to and from a line voltage;

relating a first bridge circuit to a second bridge circuit by sensing, compensating and sampling the synchronous average current over each half switching period, and superimposing a feedback signal on the modulation waveform; and generating a second duty cycle which boosts the harmonically filtered voltage controlled by the first bridge and transformer turns ratio to achieve voltage regulation of the secondary bus voltage.

* * * * *